United States Patent [19]

Shirai et al.

[11] Patent Number: 5,744,401
[45] Date of Patent: Apr. 28, 1998

[54] SILICON WAFER MANUFACTURING METHOD ELIMINATING FINAL MIRROR-POLISHING STEP

[75] Inventors: Hiroshi Shirai; Jun Yoshikawa, both of Kanagawa; Youji Ogawa, Niigata; Kazuhiko Kashima; Kazuya Ookubo, both of Kanagawa; Yukari Kohtari, Niigata; Norihiro Shimoi, Niigata; Masayuki Sanada, Niigata; Shuji Tobashi, Kanagawa, all of Japan

[73] Assignee: Toshiba Ceramics Co., Ltd., Tokyo, Japan

[21] Appl. No.: 620,195

[22] Filed: Mar. 22, 1996

[30] Foreign Application Priority Data

Mar. 24, 1995 [JP] Japan .................... 7-090135

[51] Int. Cl.$^6$ .................................... H01L 21/00
[52] U.S. Cl. .................... 438/693; 438/706; 438/715
[58] Field of Search ................ 156/636.1, 651.1, 156/646.1, 657.1, 662.1, 645.1; 437/225, 228 POL, 228 PL; 216/38, 52, 88, 89, 90

[56] References Cited

U.S. PATENT DOCUMENTS 5,571,373  11/1996  Krishna et al. .................... 156/636.1

FOREIGN PATENT DOCUMENTS 6-252154  9/1994  Japan .

Primary Examiner—William Powell
Attorney, Agent, or Firm—Finnegan, Henderson, Farabow, Garrett & Dunner, L.L.P.

[57] ABSTRACT

A silicon wafer is mirror-polished until obtaining surface roughness Ra of 0.70–1.00 nm, Rq of 0.80–1.10 nm, or Rt of 4.50–7.00 nm. The resulting wafer is heat-treated at a temperature not lower than 1,200° C. for 30 minutes to 4 hours in a hydrogen gas atmosphere. According to another aspect, a silicon wafer is mirror-polished until obtaining surface roughness values Ra' of 0.08–0.70 nm, rms of 0.10–0.90 nm, and P-V of 0.80–5.80 nm in a square area of 90 μm by 90 μm, and surface roughness values Ra' of 0.13–0.40 nm, rms of 0.18–0.50 nm, and P-V of 1.30–2.50 nm in a square area of 500 nm by 500 nm. The resulting wafer is heat-treated at 1,100°–1,300° C. for 30 minutes to 4 hours in a hydrogen gas atmosphere.

7 Claims, 6 Drawing Sheets

1ST MIRROR-POLISHING STEP

↓

(2ND MIRROR-POLISHING STEP)

↓

HEAT TREATMENT IN H₂ GAS

↓

CLEANING

↓

FINAL PRODUCT

BEFORE HEAT TREATMENT

AFTER HEAT TREATMENT

BEFORE HEAT TREATMENT

AFTER HEAT TREATMENT

SILICON WAFER MANUFACTURING METHOD ELIMINATING FINAL MIRROR-POLISHING STEP

BACKGROUND OF THE INVENTION

1. Field of the Invention

The present invention relates to a manufacturing method of a silicon wafer for semiconductor devices and, particularly, to a manufacturing method of a silicon wafer for highly integrated memories, flash memories, and the like.

2. Description of the Related Art

Conventionally, silicon wafers are manufactured in the following manner. A silicon single crystal ingot is produced by the Czochralski (CZ) method and the floating zone (FZ) method, for instance. Wafers obtained by slicing the ingot are subjected to the steps of lapping (rough grinding), chamfering, mirror-polishing, and, when necessary, chemical polishing and cleaning.

Among the above steps, the mirror-polishing is usually conducted in several steps as shown in FIG. 6: a first mirror-polishing step in which polishing particles and a polishing cloth that are relative coarse are used, a second mirror-polishing step in which polishing particles and a polishing cloth that are relatively fine are used or polishing conditions such as polishing speed are changed from the first mirror-polishing step, and, in certain situations, a final mirror-polishing step. Thereafter, a heat treatment in a hydrogen gas and cleaning are performed to complete wafer products.

In general, in the first mirror polishing step, silicon wafers that have been subjected to a chemical polishing step are polished until obtaining surface roughness Ra of 0.70–1.00 nm, surface roughness Rq of 0.80–1.10nm, and surface roughness Rt of 4.50–7.00 nm. In the final mirror-polishing step, the wafers are further polished and flattened to such an extent that semiconductor devices can be formed thereon, that is, until obtaining surface roughness Ra of less than 0.60 nm, surface roughness Rq of less than 0.75 nm, and surface roughness Rt of less than. 4.00 nm.

In this specification, the surface roughness Ra means center line average roughness as provided by JIS B0601. The surface roughness Rq means mean square roughness defined as $$Rq = \sqrt{\frac{1}{l}\int_0^l \{f(x)\}^2 dx}$$

where l is a measurement length taken from a roughness curve y=f(x), x being a coordinate along the center line and y being a coordinate in the direction of longitudinal magnification. The surface roughness Rt means a distance between a highest peak and a lowest valley within a measurement length.

While the above parameters of surface roughness are defined one-dimensionally, two-dimensional parameters may also be defined as follows for a square area S of 90 μm by 90 μm (or 500 nm by 500 nm). Where a roughness curved surface is represented by Z=f(x, y), surface roughness Ra', which is an extended, i.e., two-dimensional, version of the surface roughness Ra according to JIS B0601, is defined as $$Ra' = \frac{1}{S}\int\int_s |f(x,y)| dxdy.$$

Mean square surface roughness rms is defined as $$rms = \sqrt{\frac{1}{S}\int\int_s \{f(x,y)\}^2 dxdy}\ .$$

Surface roughness P-V is a distance between a highest peak and a lowest valley in the measurement area S.

In terms of the above-defined parameters, after the first mirror-polishing step, surface roughness of the following level is generally obtained. In a square area of 90 μm by 90 μm, Ra' is 0.40–0.70 nm, rms is 0.60–0.90 nm, and P-V is 4.00–6.00 nm. In a square area of 500 nm by 500 nm, Ra is 0.20–0.30 nm, rms is 0.20–0.30 nm, and P-V is 1.8–2.0 nm.

After the final mirror-polishing step, surface roughness of the following level is obtained. In a square area of 90 μm by 90 μm, Ra' is 0.20–0.30 nm, rms is 0.20–0.30 nm, and P-V is 2.00–3.00 nm. In a square area of 500 nm by 500 nm, Ra is 0.08–0.12 nm, rms is 0.10–0.13 nm, and P-V is 0.9–1.1 nm.

For example, in the first and final mirror-polishing steps, mechano-chemical polishing is performed by using a silicon-etchable polishing agent such as colloidal silica. In the first mirror-polishing step, desired macroscopic flatness and roughness levels are secured. In the final mirror-polishing step, a desired microscopic roughness level and a haze-free characteristic are basically attained.

In a wafer having a low level of surface roughness, haze may be observed in its entire or partial surface. Such a wafer cannot be used, in itself, for device formation, because particles in air such as fine dust are liable to attach to the wafer surface due to the nature of the surface.

Even with the above-described mirror-polishing steps, it is difficult to realize an atomically flat surface. However, recently, high-quality wafers having an atomically flat surface are required for highly integrated memories and flash memories. To satisfy this requirement, hydrogen annealing is performed after the final mirror-polishing step.

Further, to produce wafers of even better quality, there has been proposed a technique in which a high-temperature heat treatment is performed in a hydrogen gas atmosphere (see Japanese Unexamined Patent Publication No. Hei. 6-252154. According to this technique, the concentration of oxygen in a wafer surface layer can be reduced, so that a non-defect (DZ layer) having minute defects (BMDs) at only a very small concentration is formed there. This greatly improves the breakdown voltage characteristic of an oxide film formed on a wafer.

Conventionally, a heat treatment in an hydrogen gas atmosphere is performed after subject wafers have been mirror-polished to obtain a desired level of surface roughness. It is known that in a heat treatment in an atmosphere containing a hydrogen gas, the hydrogen gas has a weak etching ability with respect to silicon. However, it has not been attempted to positively utilize this weak etching ability.

As described above, the conventional manufacturing method requires a plurality of mirror-polishing steps and a heat treatment in a hydrogen gas atmosphere which is performed after obtaining a desired level of surface roughness, and therefore the number of manufacturing steps is large.

The present inventors made detailed studies on the surface states of wafers that were heat-treated in a hydrogen gas atmosphere after having been mirror-polished to a desired level of surface roughness. And the inventors have found that the surface roughness and the degree of undulation of heat-treated wafers are somewhat improved, and that these improvements are due to the heat treatment in a hydrogen gas atmosphere. After further investigations, the inventors have found that by subjecting silicon wafers having a particular level of surface roughness to a heat treatment in a hydrogen gas atmosphere, there can be obtained wafers having substantially the same surface roughness as wafers that would be obtained by the above-mentioned final mirror-polishing step.

SUMMARY OF THE INVENTION

An object of the present invention is to improve the surface state of a silicon wafer by applying, to a silicon wafer whose surface state is on a particular level, a weak effect of etching the wafer surface which effect occurs when a heat treatment is performed in an atmosphere containing a hydrogen gas.

Another object is to improve the above technique, to thereby provide a manufacturing method of a silicon wafer which method enables high-quality surface finishing at a low cost.

According to the invention, there is provided a manufacturing method of a silicon wafer, comprising the steps of:

preparing a silicon wafer having surface roughness Ra of 0.70–1.00 nm, Rq of 0.80–1.10 nm, or Rt of 4.50–7.00 nm; and heat-treating the silicon wafer at a temperature not lower than 1,200° C. for 30 minutes to 4 hours in a hydrogen gas atmosphere, to thereby produce a silicon wafer product having surface roughness Ra of less than 0.60 nm, Rq of less than 0.75 nm, or Rt of less than 4.00 nm.

In the above manufacturing method, a silicon wafer whose surface roughness is worse than that as obtained by an ordinary final mirror-polishing step is heat-treated at a temperature not lower than 1,200° C. in a hydrogen gas atmosphere. A hydrogen gas selectively etches minute, submicron-order or even smaller asperities, to allow production of a silicon wafer with improved surface roughness, which is equivalent to surface roughness as obtained by performing the ordinary final mirror-polishing step. As a result, the ordinary final mirror-polishing step can be eliminated, to allow simplification of a silicon wafer manufacturing process.

According to another aspect of the invention, there is provided a manufacturing method of a silicon wafer, comprising the steps of:

preparing a silicon wafer having surface roughness values Ra' of 0.08–0.70 nm, rms of 0.10–0.90 nm, and P-V of 0.80–5.80 nm in a square area of 90 μm by 90 μm, and surface roughness values Ra' of 0.13–0.40 nm, rms of 0.18–0.50 nm, and P-V of 1.30–2.50 nm in a square area of 500 nm by 500 nm; and heat-treating the silicon wafer at 1,100°–1,300° C. for 30 minutes to 4 hours in a hydrogen gas atmosphere.

In the above manufacturing method, a silicon wafer whose surface roughness is worse than that as obtained by an ordinary final mirror-polishing step is heat-treated at 1,100°–1,300° C. in a hydrogen gas atmosphere. The surface roughness of the silicon wafer is improved by surface reconstruction.

DESCRIPTION OF THE PREFERRED EMBODIMENTS

Embodiment 1

Figure 1:
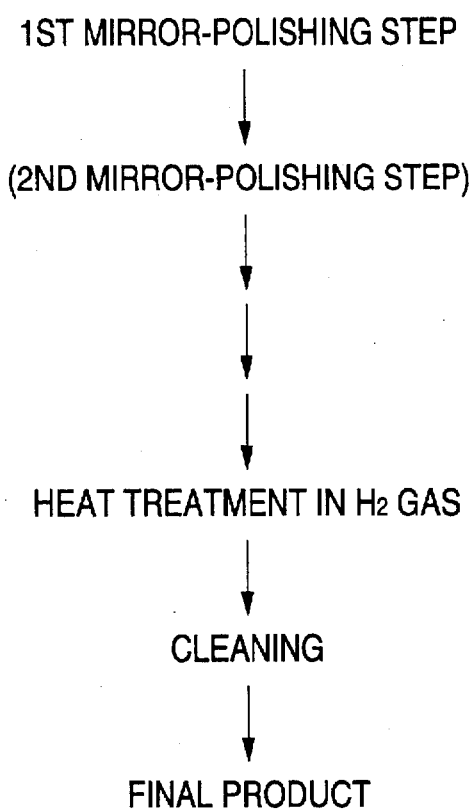
FIG. 1 shows a general flow of a manufacturing method of a silicon wafer according to a first embodiment of the present invention.

In this embodiment, to prepare silicon wafers, a silicon single crystal ingot that has been produced by an ordinary CZ or FZ method is sliced into wafers, which are then subjected to a lapping step and a chemical polishing step. Subsequently, as shown in FIG. 1, resulting wafers are mirror-polished until obtaining surface roughness Ra of 0.70–1.00 nm, surface roughness Rq of 0.80–1.10 nm, or surface roughness Rt of 4.50–7.00 nm. If Ra exceeds 1.00 nm, if Rq exceeds 1.10 nm, or if Rt exceeds 7.00 nm, surface asperities remain even after a subsequent heat treatment in a hydrogen gas atmosphere and such wafers are, in themselves, not suitable for formation of semiconductor devices thereon. That is, a final mirror-polishing step is needed.

On the other hand, if Ra is smaller than 0.70 nm, if Rq is smaller than 0.80 nm, or if Rt is smaller than 4.50 nm, such a wafer is necessarily one that has been subjected to a final mirror-polishing step and a surface roughness improvement by the heat treatment in a hydrogen gas atmosphere is small.

In this embodiment, since the surface roughness is improved by the heat treatment in a hydrogen gas atmosphere, it is not necessary to perform mirror-polishing until obtaining a mirror-finished state as would be obtained by the ordinary final mirror-polishing step. It suffices that silicon wafers be mirror-polished until obtaining surface roughness in the above-mentioned range.

Mirror-polishing may be performed in plural steps rather than a single step. What is required is merely to mirror-polish wafers until they have surface roughness in the above-mentioned range.

It is preferred that the heat treatment be conducted in a substantially 100% hydrogen gas atmosphere. This does not exclude, from the scope of the invention, mixing of a carrier gas such as an inert gas. However, since the existence of a carrier gas lowers the etching effect of a hydrogen gas, it is preferred that the heat treatment be conducted in an atmosphere that is made substantially only of a hydrogen gas.

If the temperature of the heat treatment is lower than 1,200° C., or if its duration is shorter than 30 minutes, the effect of surface roughness improvement is insufficient for production of silicon wafers having a desired level of surface roughness.

On the other hand, even if the heat treatment is performed for more than 4 hours, only slight improvement is obtained additionally in surface roughness. This is therefore not preferable in terms of energy saving and productivity.

Examples 1 and 2 of the invention will be described below in comparison with Comparative Example 1.

[Example 1]

A silicon single crystal ingot produced by a CZ method was subjected to a slicing step, a lapping step, a chemical polishing step, and a first mirror-polishing step, to provide a mirror-polished silicon wafer. This wafer had surface roughness Ra of 0.71 nm, surface roughness Rq of 0.87 nm, and surface roughness Rt of 4.60 nm.

The wafer was heat-treated at 1,200° C. for 1 hour in a substantially 100% hydrogen-atmosphere. After the heat treatment, the wafer had Ra of 0.56 nm, Rq of 0.67 nm, and Rt of 2.92 nm. Further, it had surface roughness Rz of 2.77 nm.

Figure 2:
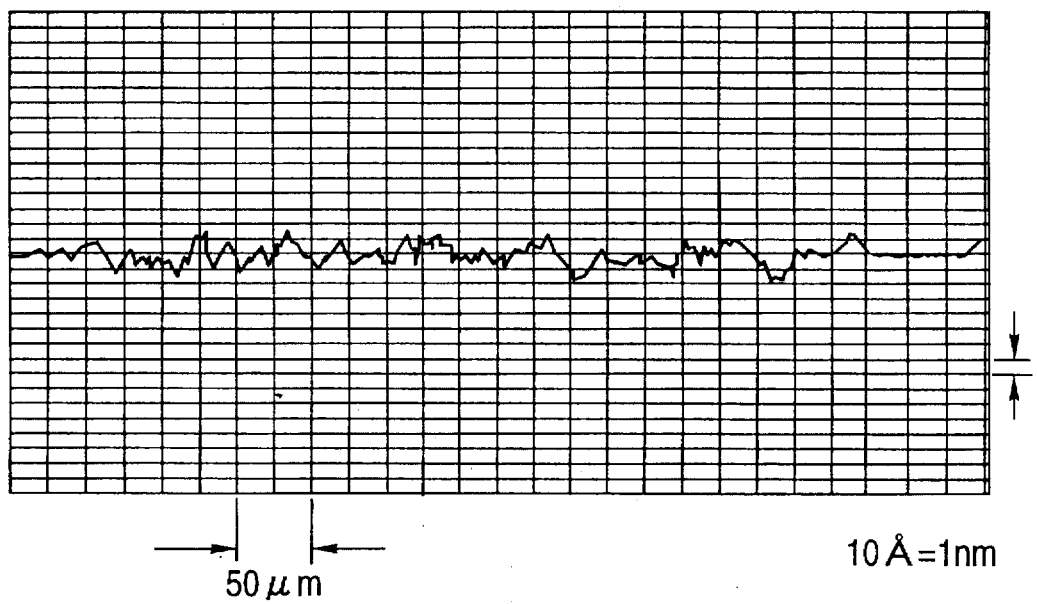
FIGS. 2 and 3 show surface states of a silicon wafer before and after it is subjected to a heat treatment in the first embodiment of the invention (Example 1)
Figure 3:
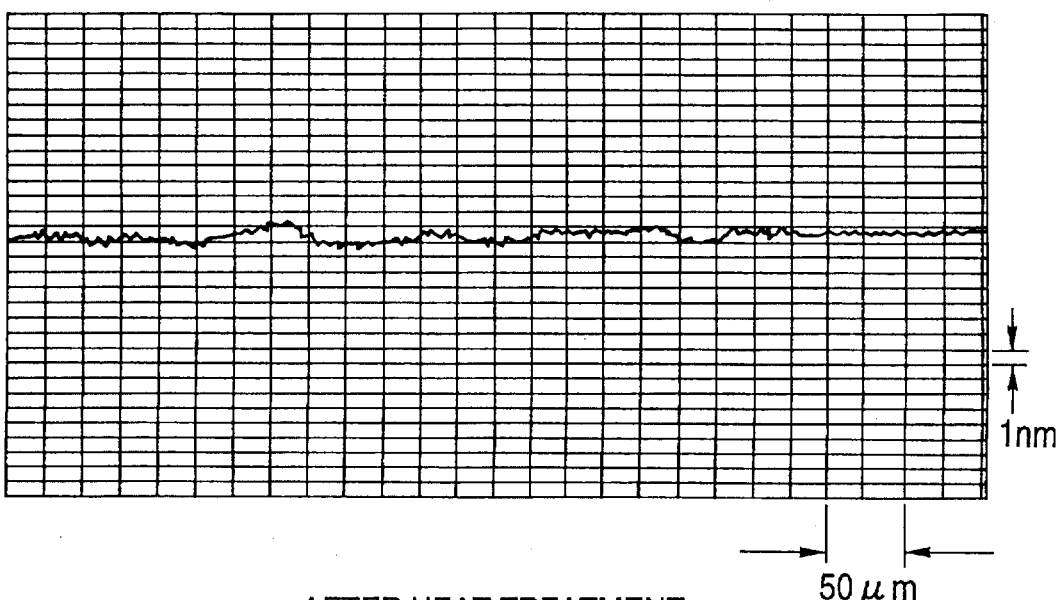

The surface roughness measurement was conducted by using a Taly Step measuring instrument of Rank Taylor Hobson K.K. A 0.5-mm measurement length was set at a central portion of a wafer. Measured surface states of the wafer before and after the heat treatment are shown in Table 1 and FIGS. 2 and 3.

TABLE 1

|  |  | Example 1 | Example 2 | Comp. Example 1 |
|---|---|---|---|---|
| Before heat treatment | Ra | 0.71 | 0.82 | 0.49 |
|  | Rq | 0.87 | 0.99 | 0.59 |
|  | Rt | 4.60 | 6.08 | 2.64 |
| Heat treatment conditions | Atmosphere | 100% H$_2$ | 100% H$_2$ | 100% H$_2$ |
|  | Temp. (°C.) | 1,200 | 1,250 | 1,200 |
|  | Duration | 1 hr | 2 hr | 1 hr |
| After heat treatment | Ra | 0.56 | 0.59 | 0.37 |
|  | Rq | 0.67 | 0.72 | 0.47 |
|  | Rt | 2.92 | 3.44 | 2.42 |

[Example 2]

Another wafer that was prepared in the same manner as in Example 1 was subjected to a surface state measurement, to produce Ra of 0.82 nm, Rq of 0.99 nm, and Rt of 6.08 nm.

This wafer was heat-treated at 1,250° C. for 2 hours in a hydrogen gas atmosphere. After the heat treatment, the wafer had Ra of 0.59 nm, Rq of 0.72 nm, and Rt of 3.44 nm. Measurement results are shown in Table 1.

[Comparative Example 1]

A silicon single crystal ingot produced by a CZ method was subjected to conventional steps including first and final mirror-polishing steps, to provide a mirror-polished silicon wafer, which had Ra of 0.49 nm, Rq of 0.59 nm, and Rt of 2.64 nm.

Figure 4:
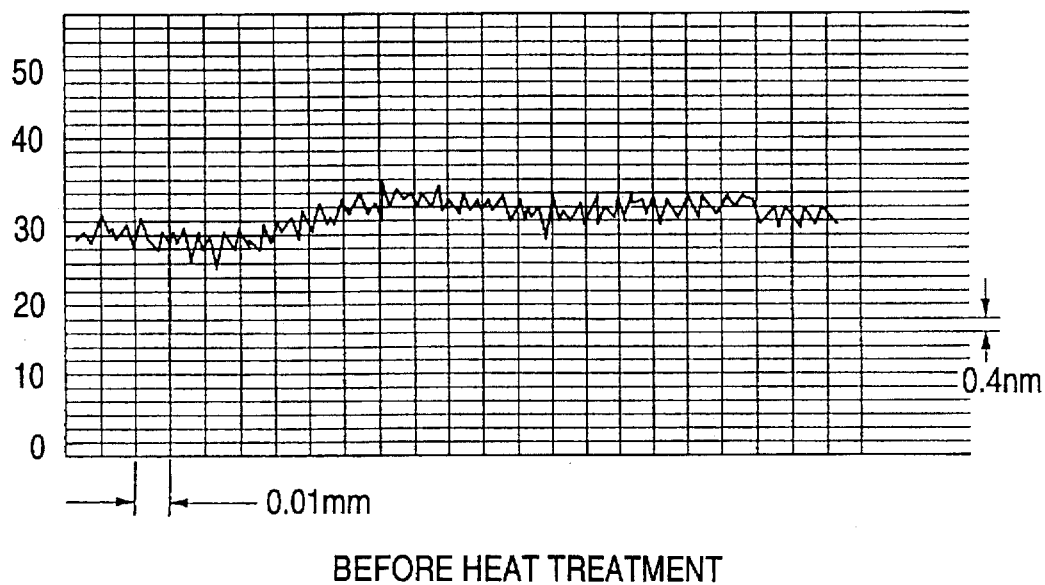
FIGS. 4 and 5 show surface states of a silicon wafer before and after it is subjected to a heat treatment in a conventional manufacturing method (Comparative Example 1)
Figure 5:
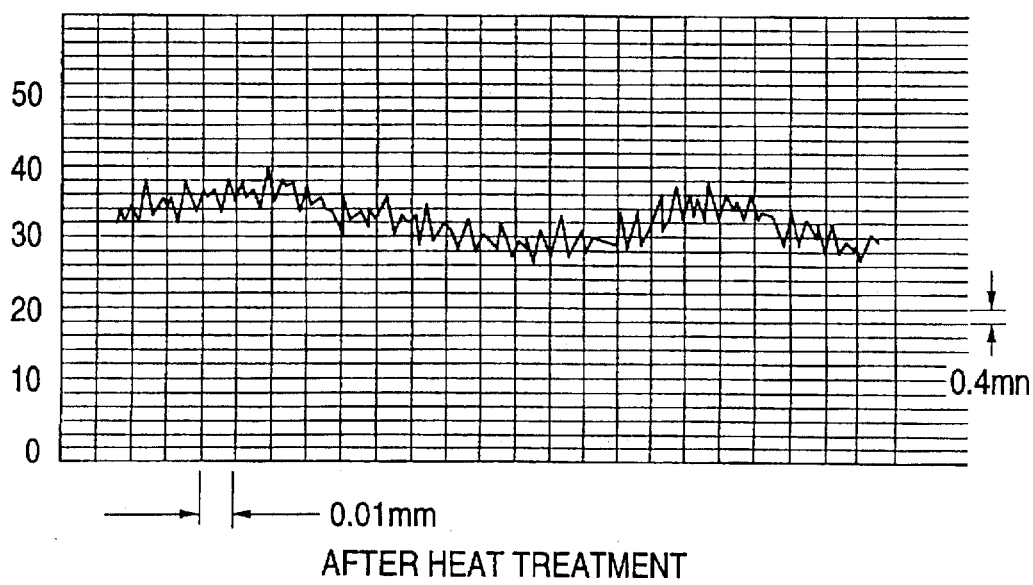
Figure 6:
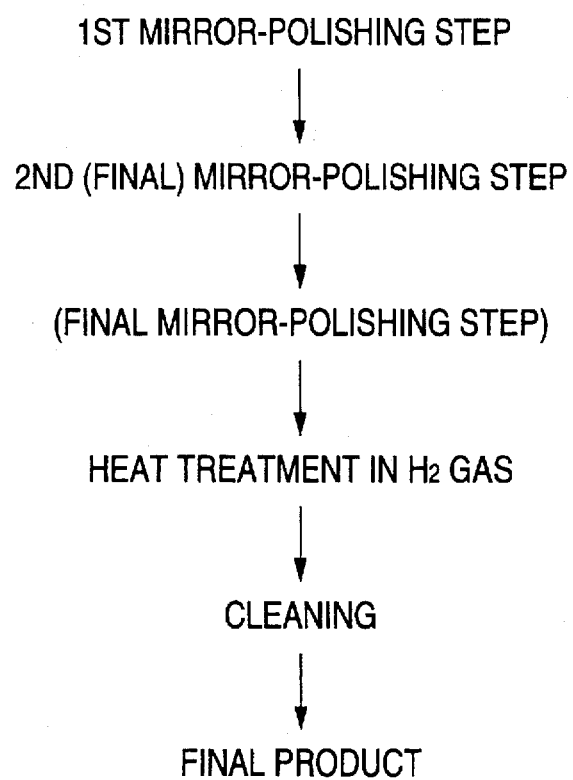
FIG. 6 shows a general flow of a conventional manufacturing method of a silicon wafer.

This wafer was heat-treated at 1,200° C. for 1 hour in a 100% hydrogen atmosphere. After the heat treatment, the wafer had Ra of 0.37 nm, Rq of 0.47 nm, and Rt of 2.42 nm. Measurement results are shown in Table 1. FIGS. 4 and 5 show surface states before and after the heat treatment.

The results of Examples 1 and 2 and Comparative Example 1 support the following. By heat-treating a wafer having a predetermined level of surface roughness at a temperature not lower than 1,200° C. for 30 minutes to 4 hours in a hydrogen gas atmosphere, the surface state of the wafer is improved enough to allow elimination of the final mirror-polishing step. It is also understood that although the surface state of a wafer that has been subjected to the final mirror-polishing step and therefore has better surface roughness is also improved by the above heat treatment, the degree of improvement is small.

As described above, according to the silicon wafer manufacturing method of this embodiment, wafers having such a surface state as allows semiconductor devices to be formed thereon can be obtained without the need of performing a final mirror-polishing step. As such, this embodiment is very useful from the industrial view point.

Embodiment 2

In this embodiment, to prepare silicon wafers, a silicon single crystal ingot that has been produced by an ordinary CZ or FZ method is sliced into wafers, which are then subjected to a lapping step and a chemical polishing step. Subsequently, resulting wafers are mirror-polished until obtaining a surface roughness Ra' of 0.08–0.70 nm, surface roughness rms of 0.10–0.90 nm, and surface roughness P-V of 0.80–5.80 nm in a square area of 90 μm by 90 μm, and Ra' of 0.13–0.40 nm, rms of 0.18–0.50 nm, and P-V of 1.30–2.50 nm in a square area of 500 nm by 500 nm.

If the surface roughness is worse than that of the above ranges, surface roughness improvement due to surface reconstruction is not enough to obtain a desired level of final surface roughness. That is, a final mirror-polishing step is needed to obtain a superior mirror-finished surface.

On the other hand, to secure surface roughness better than that of the above ranges, a final mirror-polishing step cannot be omitted. This is costly and the surface state improvement effect of a heat treatment is small; the process is inefficient.

In this embodiment, silicon wafers that have been prepared in the above manner are heat-treated at 1,100–1,300° C. for 30 minutes to 4 hours in a hydrogen gas atmosphere, to obtain Ra' of less than 0.10 nm, rms of less than 0.12 nm, and P-V of less than 1.0 nm in a square area of 500 nm by 500 nm.

If the heat treatment temperature is lower than 1,100° C. or higher than 1,300° C., or if the heat treatment time is shorter than 30 minutes, the surface state improvement effect is small; it is difficult to produce silicon wafers having surface roughness in the above ranges. On the other hand, even if the heat treatment is performed for more than 4 hours, only slight improvement is obtained additionally in surface roughness. This is therefore not preferable in terms of cost and productivity.

In the heat treatment step, a carrier gas such as an inert gas may be mixed. However, to secure high etching efficiency, it is preferred that the heat treatment be conducted in a substantially 100% hydrogen gas atmosphere.

By performing a heat treatment under the above-described conditions, an atomically flat surface constituted of terraces, step walls, etc., which is measurable by an AFM (interatomic force microscope), is formed by surface reconstruction in a microscopic region that is smaller than a square area of 1 μm by 1 μm. As a result, values of the surface roughness parameters Ra', rms and P-V can be reduced in the same microscopic region.

The above surface roughness improving effect can convert a non-haze-free mirror-polished surface to a haze-free surface. However, the heat treatment cannot improve larger-scale surface roughness (for instance, surface roughness in a square area of 90 μm by 90 μm) to a large extent. Therefore, it is necessary that mirror-polished wafers have macroscopic surface roughness in the above-mentioned ranges. Since mirror-polished wafers need not be haze-free, the mirror-polishing step can be performed in short time at a low cost.

In this embodiment, by heat-treating, in a hydrogen atmosphere, silicon wafers having surface roughness in the above-mentioned ranges, wafers can be rendered microscopically flat (atomically flat, in particular) as well as haze-free.

Figure 7:
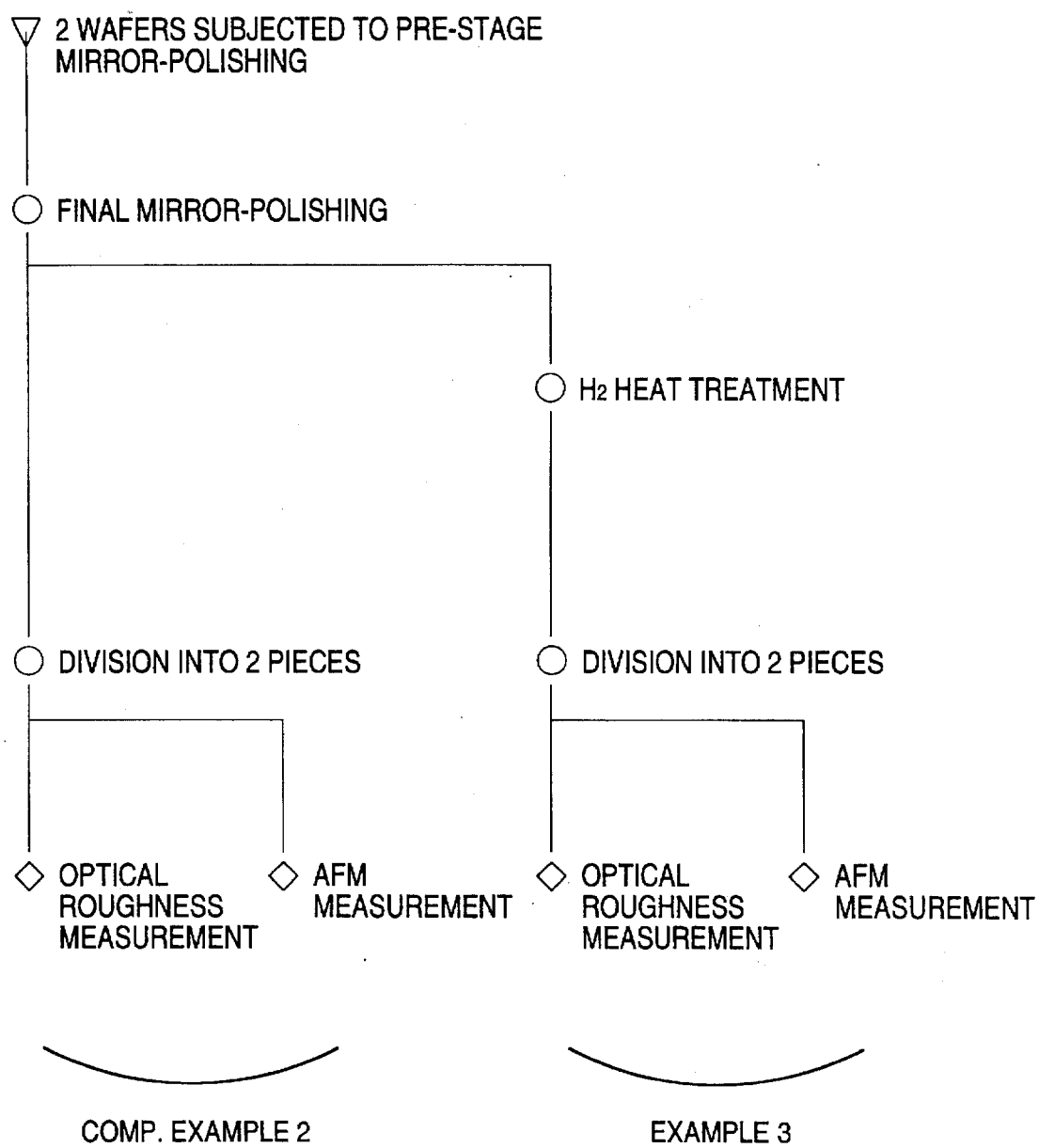
FIG. 7 shows flows of Example 3 and Comparative Example 2.
Figure 8:
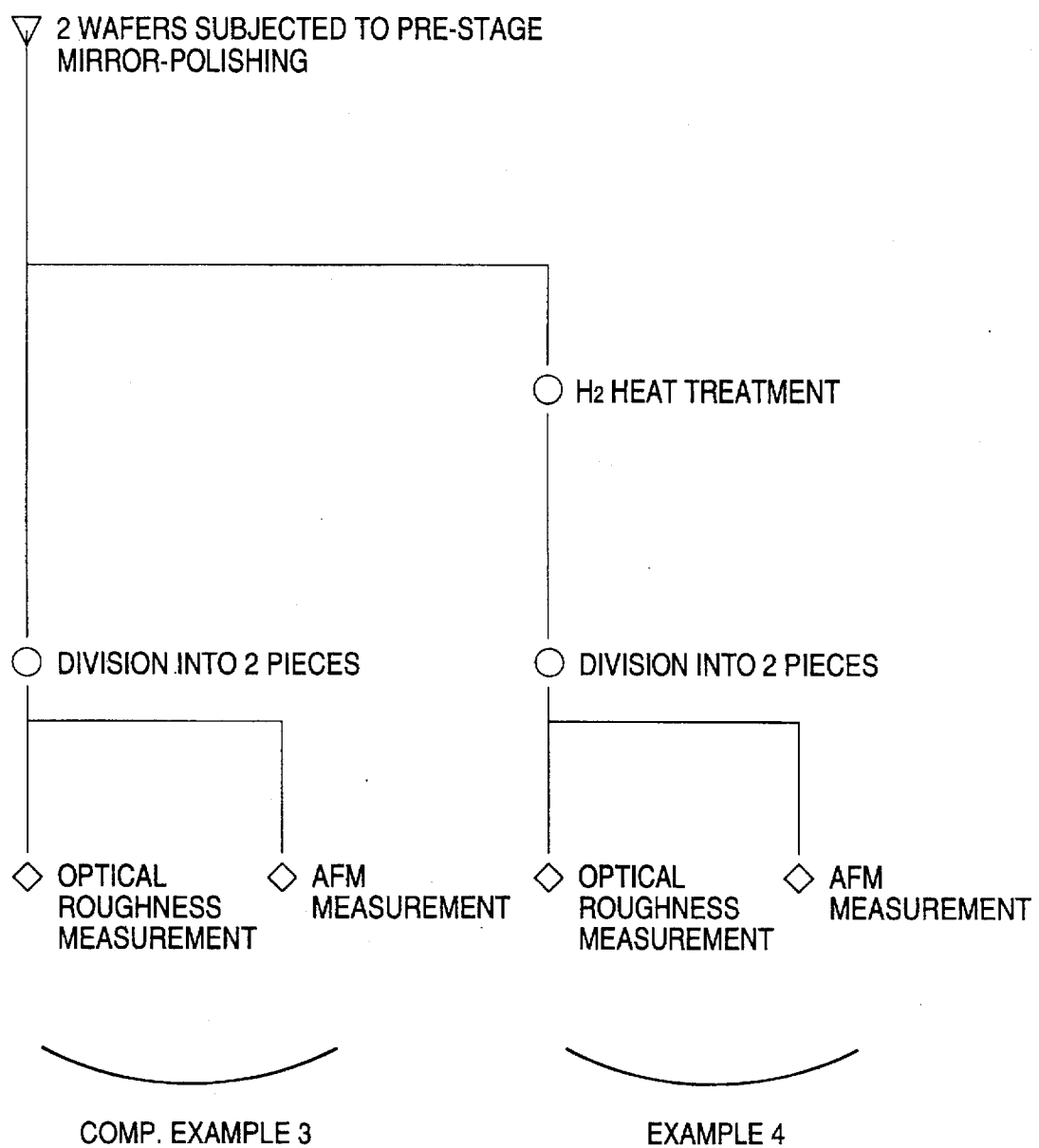
FIG. 8 shows flows of Example 4 and Comparative Example 3.

Examples 3 and 4 will be described below in comparison with Comparative Examples 2 and 3. FIGS. 7 and 8 show process flows of these examples.

A silicon single crystal in got produced by a CZ method was sliced into wafers, which were then subjected to a lapping step, a chemical polishing step, and a pre-stage mirror-polishing step, to provide silicon wafers that were mirror-polished to some extent.

Two of the thus-prepared wafers were subjected to a conventional final mirror-polishing step, and one of the two wafers was then heat-treated at 1,200° C. for 1 hour in a hydrogen atmosphere (Example 3). The other wafer was not heat-treated (Comparative Example 2). These two wafers were subjected to surface roughness measurements by use of an optical roughness meter (trade name "ZYGO") and an interatomic force microscope (AFM).

Of another two of the wafers as subjected to the pre-stage mirror-polishing step, one wafer was heat-treated at 1,200° C. for 1 hour in a hydrogen atmosphere (Example 4). The other wafer was not heat-treated (Comparative Example 3). These two wafers were subjected to surface roughness measurements by use of an optical roughness meter (trade name "ZYGO") and an interatomic force microscope (AFM).

Measurement results are shown in Table 2.

TABLE 2

| | Polish-ing state | Heat treat-ment | Optical roughness meter (90 μm □) | | | AFM (500 nm □) | | |
|---|---|---|---|---|---|---|---|---|
| | | | Ra' (nm) | rms (nm) | P-V (nm) | Ra' (nm) | rms (nm) | P-V (nm) |
| Ex. 3 | Final | $H_2$ | 0.22 | 0.27 | 2.27 | 0.508 | 0.08 | 0.314 |
| Ex. 4 | Pre-stage | $H_2$ | 0.49 | 0.62 | 4.45 | 0.055 | 0.07 | 0.61 |
| Com. Ex. 2 | Final | None | 0.20 | 0.25 | 2.80 | 0.1 | 0.12 | 1.0 |
| Com. Ex. 3 | Pre-stage | None | 0.65 | 0.81 | 5.54 | 0.20 | 0.26 | 1.9 |

It is seen from Table 2 that if a wafer as subjected to the pre-stage mirror-polishing step is heat-treated in a hydrogen gas, the surface roughness is not much improved in a square area of 90 μm by 90 μm, but is greatly improved in a square area of 500 nm by 500 nm.

It is also seen that by performing the final mirror-polishing step, not only surface roughness in a square area of 90 μm by 90 μm can be improved, but also surface roughness in a square area of 500 nm by 500 nm can be approximately halved from the case where only the pre-stage mirror-polishing step is performed. Where the final mirror-polishing step is performed, haze does not appear unlike the case where only the pre-stage mirror-polishing step is performed.

If optimized, the pre-stage mirror-polishing step can provide surface roughness in a square of 90 μm by 90 μm which is on the same level as in the case where the final mirror-polishing step is performed. Therefore, if surface roughness values in the above-mentioned ranges are secured both in a square of 90 μm by 90 μm and in a square of 500 nm by 500 nm, the final mirror-polishing step can be replaced by the heat treatment in a hydrogen atmosphere.

It should be noted that in a wafer produced with replacement of the final stage mirror-polishing step with the heat treatment in a hydrogen atmosphere, not only the microscopic roughness (in a square area of 500 nm by 500 nm) can be improved from the case of performing the final mirror-polishing step, but also an atomically flat surface can be formed which is constituted of terraces, step walls, etc. As mentioned above, usually a wafer subjected to the final mirror-polishing step does not have an atomically flat surface but has an atomically random surface.

An atomically flat surface is considered essential to improving the reliability of an extremely thin oxide film for flash memories, etc. This embodiment can produce very useful silicon wafer for that purpose.

As described above, according to the manufacturing method of this embodiment, high-quality mirror-finished silicon wafers can be produced at a low cost. In particular, even without the final mirror-polishing step that is indispensable in the conventional manufacturing method, there can be obtained surface accuracy equivalent to or higher than that as obtained in the case of performing the final mirror-polishing step. In addition, a finished surface can be rendered atomically flat.

What is claimed is:

1. A manufacturing method of a silicon wafer, comprising the steps of:

preparing a silicon wafer having surface roughness Ra of 0.70–1.00 nm; and heat-treating the silicon wafer at a temperature not lower than 1,200° C. for 30 minutes to 4 hours in a hydrogen gas atmosphere, to thereby produce a silicon wafer product having surface roughness Ra of less than 0.60 nm.

2. A manufacturing method of a silicon wafer, comprising the steps of:

preparing a silicon wafer having surface roughness Rq of 0.80–1.10 nm; and heat-treating the silicon wafer at a temperature not lower than 1,200° C. for 30 minutes to 4 hours in a hydrogen gas atmosphere, to thereby produce a silicon wafer product having surface roughness Rq of less than 0.75 nm.

3. A manufacturing method of a silicon wafer, comprising the steps of:

preparing a silicon wafer having surface roughness Rt of 4.50–7.00 nm; and heat-treating the silicon wafer at a temperature not lower than 1,200° C. for 30 minutes to 4 hours in a hydrogen gas atmosphere, to thereby produce a silicon wafer product having surface roughness Rt of less than 4.00 nm.

4. A manufacturing method of a silicon wafer, comprising the steps of:

preparing a silicon wafer having surface roughness values Ra' of 0.08–0.70 nm, rms of 0.10–0.90 nm, and P-V of 0.80–5.80 nm in a square area of 90 μm by 90 μm, and surface roughness values Ra' of 0.13–0.40 nm, rms of 0.18–0.50 nm, and P-V of 1.30–2.50 nm in a square area of 500 nm by 500 nm; and heat-treating the silicon wafer at 1,100°–1,300° C. for 30 minutes to 4 hours in a hydrogen gas atmosphere.

5. The manufacturing method according to claim 4, wherein a mirror-polishing step of the preparing step includes only a pre-stage mirror-polishing step.

6. The manufacturing method according to claim 4, wherein the heat-treating step produces a silicon wafer product having surface roughness values Ra' of less than 0.10 nm, rms of 0.12 nm, and P-V of 1.0 nm in the square area of 500 nm by 500 nm.

7. The manufacturing method according to claim 4, wherein the heat-treating step produces a silicon wafer product having an atomically flat surface.

* * * * *